(12) United States Patent
Aimone et al.

(10) Patent No.: US 10,049,793 B2
(45) Date of Patent: Aug. 14, 2018

(54) FABRICATION OF REINFORCED SUPERCONDUCTING WIRES

(71) Applicants: Paul Aimone, Bridgewater, MA (US); Francois-Charles Dary, Boston, MA (US); David B. Smathers, Columbus, OH (US)

(72) Inventors: Paul Aimone, Bridgewater, MA (US); Francois-Charles Dary, Boston, MA (US); David B. Smathers, Columbus, OH (US)

(73) Assignee: H.C. STARCK INC., Newton, MA (US)

( * ) Notice: Subject to any disclaimer, the term of this patent is extended or adjusted under 35 U.S.C. 154(b) by 0 days.

(21) Appl. No.: 15/205,804

(22) Filed: Jul. 8, 2016

(65) Prior Publication Data

US 2017/0309375 A1   Oct. 26, 2017

Related U.S. Application Data

(60) Provisional application No. 62/192,321, filed on Jul. 14, 2015.

(51) Int. Cl.
| | |
|---|---|
| *H01B 12/00* | (2006.01) |
| *H01B 12/10* | (2006.01) |
| *C22F 1/18* | (2006.01) |
| *C22C 27/02* | (2006.01) |
| *H01B 13/00* | (2006.01) |
| *H01B 1/02* | (2006.01) |
| *B21C 3/04* | (2006.01) |

(52) U.S. Cl.
CPC ............... *H01B 12/10* (2013.01); *B21C 3/04* (2013.01); *C22C 27/02* (2013.01); *C22F 1/18* (2013.01); *H01B 1/026* (2013.01); *H01B 13/0036* (2013.01)

(58) Field of Classification Search
CPC . H01L 39/2409; H01L 39/12; H01L 39/2403; H01L 39/2406; H01B 1/026; H01B 12/10; H01B 12/06; C22C 27/02
See application file for complete search history.

(56) References Cited

U.S. PATENT DOCUMENTS

| | | | |
|---|---|---|---|
| 3,592,639 A * | 7/1971 | Schussler | C22C 27/02 420/427 |
| 2005/0178472 A1 | 8/2005 | Hong et al. | |
| 2007/0186998 A1 * | 8/2007 | Kato | H01L 39/2409 148/98 |
| 2007/0238620 A1 | 10/2007 | Flukiger et al. | |
| 2009/0005251 A1 | 1/2009 | Flukiger et al. | |
| 2010/0093546 A1 | 4/2010 | Schlenga et al. | |

(Continued)

OTHER PUBLICATIONS

International Search Report and Written Opinion, International Application No. PCT/US16/41556, dated Mar. 30, 2017, 13 pages.

*Primary Examiner* — Chou N Nguyen
*Assistant Examiner* — Roshn Varghese
(74) *Attorney, Agent, or Firm* — Morgan, Lewis & Bockius LLP (57) ABSTRACT

In various embodiments, superconducting wires feature assemblies of clad composite filaments and/or stabilized composite filaments embedded within a wire matrix. The wires may include one or more stabilizing elements for improved mechanical properties.

22 Claims, 4 Drawing Sheets

(56) References Cited

U.S. PATENT DOCUMENTS

2012/0108437 A1* 5/2012 Ohata ................ H01L 39/2409
                                                    505/231
2015/0024943 A1    1/2015 Sugimoto et al.
2015/0348679 A1* 12/2015 Takeuchi ................ H01L 39/12
                                                    505/510

* cited by examiner

FABRICATION OF REINFORCED SUPERCONDUCTING WIRES

RELATED APPLICATION

This application claims the benefit of and priority to U.S. Provisional Patent Application No. 62/192,321, filed Jul. 14, 2015, the entire disclosure of which is hereby incorporated herein by reference.

TECHNICAL FIELD

In various embodiments, the present invention relates to the formation and processing of superconducting wires that are reinforced for additional mechanical strength.

BACKGROUND

A superconducting material exhibits no electrical resistance when cooled below its characteristic critical temperature. Although high-temperature superconductor materials, which have critical temperatures higher than the 77K boiling point of nitrogen, have been identified, these materials are often exotic (e.g., perovskite ceramics), difficult to process, and unsuitable for high-field applications. Thus, for practical superconducting applications requiring wires and coils and bundles thereof, the metallic superconductors Nb—Ti and $Nb_3Sn$ are most often utilized. While these materials have critical temperatures below 77K, the relative ease of processing these materials (e.g., drawing into wires) when compared to ceramic-based solutions, as well as their ability to operate at high currents and high magnetic fields, have resulted in their widespread use.

Typical metallic superconducting wires feature multiple strands (or "filaments") of the superconducting phase embedded within a copper (Cu) conductive matrix. While this has resulted in the successful fabrication of metallic superconducting wires utilized for a host of different applications, the resulting wires often exhibit insufficient mechanical strength. While the copper matrix surrounding the superconducting filaments does provide some mechanical stability, copper is a very ductile, easily deformed material. Thus, there is a need for improved metallic superconducting wires incorporating a mechanical stabilizer that is sufficiently ductile (and thus drawable into wire) and that does not excessively diffuse into the copper (or Cu-based) wire matrix (and thus compromise its conductivity) during elevated heat treatments.

SUMMARY

In accordance with various embodiments of the present invention, a superconducting wire and/or precursor thereof (e.g., a composite filament utilized to form the wire) features one or more stabilizing elements including, consisting essentially of, or consisting of one or more metals having one or more mechanical properties (e.g., strength, yield strength, tensile strength, stiffness, Young's modulus, etc.) superior to that of the wire matrix (which is typically based on Cu to facilitate drawability into wire) and/or of the monofilaments (typically Nb-based) that are superconducting or that will subsequently react with one or more other species (e.g., Sn) to produce a superconducting phase. Exemplary stabilizing elements in accordance with embodiments of the invention may include, consist essentially of, or consist of tantalum (Ta) or a Ta alloy. As mentioned above, the stabilizing element is typically disposed within a Cu-based wire matrix along with multiple monofilaments and/or composite filaments that contain Nb. One or more stabilizing elements may be disposed substantially at the center of the composite filament or the superconducting wire, and/or one or more stabilizing elements may be disposed away from the core (e.g., proximate the periphery) of the composite filament or the superconducting wire. The composite filaments (and, in various embodiments, the stabilizing element) may have a cross-sectional shape facilitating efficient stacking of the various elements within the wire (e.g., hexagonal, square, rectangular, triangular). In accordance with embodiments, of the invention, monofilaments may each include, consist essentially of, or consist of a Nb-based core within a Cu-based matrix, and stacked assemblies of the monofilaments may be disposed within a Cu-based matrix and drawn down to form composite filaments. Thus, composite filaments may each include, consist essentially of, or consist of multiple Nb-based monofilaments within a Cu-based matrix. Like the composite filaments, the monofilaments may also have a cross-sectional shape facilitating efficient stacking within the composite filament (e.g., hexagonal, square, rectangular), and this cross-sectional shape may be the same as or different from the cross-sectional shape of the composite filaments.

In various embodiments, composite filaments are disposed within a Cu-based matrix (e.g., a Cu-based tube) and drawn down into the superconducting wire (or precursor thereof) and heat treated. One or more of the composite filaments may themselves be stabilized with a stabilizing element therein, and/or one or more stabilizing elements may be disposed within the Cu-based matrix of the superconducting wire in addition to the composite filaments. In various embodiments, the stabilizing element includes, consists essentially of, or consists of a Ta—W alloy including, for example, approximately 3% W (i.e., Ta-3W). In various other elements, the stabilizing element includes, consists essentially of, or consists of an alloy of Ta with nitrogen, e.g., tantalum nitride, and/or with carbon, e.g., tantalum carbide.

The superior mechanical properties of stabilizing elements in accordance with embodiments of the present invention provide improved mechanical strength to the final superconducting wires without making the wires excessively large. (In contrast, the use of various other metallic stabilizers with lesser mechanical properties would require the use of larger cores that would deleteriously impact the ductility and various other properties of the final wire.) Wires in accordance with embodiments of the present invention exhibit superior mechanical strength while retaining good high-field, high-current superconducting properties below their critical temperatures.

The use of Ta-alloy stabilizing elements advantageously enables less of the cross-section of the superconducting wire to be occupied by the stabilizing elements, and thus more of the cross-section may be occupied by current-carrying superconducting filaments. For example, a Ta—W alloy containing approximately 3% W may have a yield strength approximately 25% greater than pure Ta; thus, stabilizing cores in accordance with embodiments of the present invention may occupy approximately 25% less of the cross-sectional area of a superconducting wire than similar wires having, e.g., pure Ta cores. In various embodiments, the stabilizing element(s) may occupy less than 10% of the cross-section of the final wire (e.g., approximately 5% to approximately 8% of the cross-section), or may occupy approximately 8% to approximately 15% of the cross-section of the superconducting wire.

While exemplary stabilizing elements based on Ta and/or Ta alloys are detailed herein, stabilizing elements may include, consist essentially of, or consist of one or more other metals in accordance with embodiments of the invention. For example, stabilizing elements may include, consist essentially of, or consist of a Nb alloy having greater mechanical strength than substantially pure Nb. For example, stabilizing elements in accordance with embodiments of the invention may include, consist essentially of, or consist of an alloy of Nb with one or more of Hf, Ti, Zr, Ta, V, Y, Mo, or W. For example, stabilizing elements in accordance with embodiments of the invention may include, consist essentially of, or consist of Nb C103 alloy, which includes approximately 10% Hf, approximately 0.7%-1.3% Ti, approximately 0.7% Zr, approximately 0.5% Ta, approximately 0.5% W, and the balance Nb. In other embodiments, stabilizing elements may include, consist essentially of, or consist of a Nb B66 alloy and/or a Nb B77 alloy.

In an aspect, embodiments of the invention feature a method of forming a mechanically stabilized superconducting wire. A plurality of monofilaments is provided. One or more (or even all) of the monofilaments includes, consists essentially of, or consists of a core and a cladding at least partially surrounding the core. The core of at least one (or even all) of the monofilaments includes, consists essentially of, or consists of Nb. The cladding of at least one (or even all) of the monofilaments includes, consists essentially of, or consists of Cu. A stabilizing element is provided. The stabilizing element includes, consists essentially of, or consists of a core and a cladding at least partially surrounding the core. The core of the stabilizing element includes, consists essentially of, or consists of Ta and/or a Ta alloy. The cladding of the stabilizing element includes, consists essentially of, or consists of Cu. A plurality of composite filaments is fabricated by, for each composite filament, (i) assembling a plurality of the monofilaments into a monofilament stack, (ii) at least partially surrounding the monofilament stack with a cladding comprising Cu, and (iii) reducing a diameter of the clad monofilament stack. Optionally, a cross-sectional shape of the clad monofilament stack may be altered. A plurality of the composite filaments and the stabilizing element are assembled into a composite stack. The stabilizing element extends through a radial dimension of the composite stack. The composite stack is at least partially surrounded with a cladding. The cladding of the composite stack includes, consists essentially of, or consists of Cu. A diameter (or other radial or lateral dimension) of the clad composite stack is reduced to form a wire.

Embodiments of the invention may include one or more of the following in any of a variety of combinations. The stabilizing element may be disposed substantially at a radial center of the composite stack. One or more (or even each) of the monofilaments may be provided by a process including, consisting essentially of, or consisting of (i) disposing a rod including, consisting essentially of, or consisting of Nb into a tube including, consisting essentially of, or consisting of Cu to form a clad rod, (ii) reducing a diameter of the clad rod, and (iii) optionally, altering a cross-sectional shape of the clad rod. Altering the cross-sectional shape of the clad rod may include, consist essentially of, or consist of drawing the clad rod through a hexagonal die. Providing the stabilizing element may include, consist essentially of, or consist of (i) disposing a rod including, consisting essentially of, or consisting of Ta and/or a Ta alloy into a tube including, consisting essentially of, or consisting of Cu to form a clad rod, (ii) reducing a diameter of the clad rod, and (iii) optionally, altering a cross-sectional shape of the clad rod. Altering the cross-sectional shape of the clad rod may include, consist essentially of, or consist of drawing the clad rod through a hexagonal die. Altering the cross-sectional shape of the clad monofilament stack may include, consist essentially of, or consist of drawing the clad monofilament stack through a hexagonal die.

The core of the stabilizing element may include, consist essentially of, or consist of Ta. The core of the stabilizing element may include, consist essentially of, or consist of a Ta alloy, e.g., an alloy of Ta with at least one of W, C, or N. The core of the stabilizing element may include, consist essentially of, or consist of Ta-3W. Sn may be disposed within or on the wire. The wire may be annealed to form a $Nb_3Sn$ phase within the wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In another aspect, embodiments of the invention feature a method of forming a mechanically stabilized superconducting wire. A plurality of monofilaments is provided. One or more (or even each) of the monofilaments includes, consists essentially of, or consists of a core and a cladding at least partially surrounding the core. The core of one or more (or even each) of the monofilaments includes, consists essentially of, or consists of Nb. The cladding of one or more (or even each) of the monofilaments includes, consists essentially of, or consists of Cu. A plurality of stabilizing elements is provided. One or more (or even each) of the stabilizing elements includes, consists essentially of, or consists of a core and a cladding at least partially surrounding the core. The core of one or more (or even each) of the stabilizing elements includes, consists essentially of, or consists of Ta and/or a Ta alloy. The cladding of one or more (or even each) of the stabilizing elements includes, consists essentially of, or consists of Cu. A plurality of composite filaments is fabricated by, for each composite filament, (i) assembling a plurality of the monofilaments and a first one or more of the stabilizing elements into a monofilament stack, wherein the first one or more of the stabilizing elements extend through an axial dimension of the monofilament stack, (ii) at least partially surrounding the monofilament stack with a cladding including, consisting essentially of, or consisting of Cu, and (iii) reducing a diameter of the clad monofilament stack. Optionally, a cross-sectional shape of the clad monofilament stack may be altered. A plurality of the composite filaments is assembled into a composite stack. The composite stack is at least partially surrounded with a cladding including, consisting essentially of, or consisting of Cu. A diameter (or other radial or lateral dimension) of the clad composite stack is reduced to form a wire.

Embodiments of the invention may include one or more of the following in any of a variety of combinations. A second one or more of the stabilizing elements may be assembled with the plurality of composite filaments to form the composite stack. The second one or more stabilizing elements may extend through an axial dimension of the composite stack. The second one or more stabilizing elements may be disposed substantially at a radial center of the composite stack. The second one or more stabilizing elements may occupy less than approximately 20% of a cross-section of the wire, less than approximately 10% of a cross-section of the wire, or less than approximately 5% of a cross-section of the wire. The second one or more stabilizing elements may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

The first one or more stabilizing elements may be disposed substantially at a radial center of one or more (or even each) of the monofilament stacks. Less than approximately 20% of a cross-section of at least one (or even each) of the composite filaments may be occupied by the first one or more stabilizing elements. Less than approximately 10% of a cross-section of at least one (or even each) of the composite filaments may be occupied by the first one or more stabilizing elements. Less than approximately 5% of a cross-section of at least one (or even each) of the composite filaments may be occupied by the first one or more stabilizing elements. More than approximately 1% of a cross-section of at least one (or even each) of the composite filaments may be occupied by the first one or more stabilizing elements. More than approximately 2% of a cross-section of at least one (or even each) of the composite filaments may be occupied by the first one or more stabilizing elements. More than approximately 5% of a cross-section of at least one (or even each) of the composite filaments may be occupied by the first one or more stabilizing elements. More than approximately 8% of a cross-section of at least one (or even each) of the composite filaments may be occupied by the first one or more stabilizing elements. More than approximately 10% of a cross-section of at least one (or even each) of the composite filaments may be occupied by the first one or more stabilizing elements.

At least one (or even each) of the monofilaments may be provided by a process including, consisting essentially of, or consisting of (i) disposing a rod including, consisting essentially of, or consisting of Nb into a tube including, consisting essentially of, or consisting of Cu to form a clad rod, (ii) reducing a diameter of the clad rod, and (iii) optionally, altering a cross-sectional shape of the clad rod. Altering the cross-sectional shape of the clad rod may include, consist essentially of, or consist of drawing the clad rod through a hexagonal die. At least one (or even each) of the stabilizing elements may be provided by a process including, consisting essentially of, or consisting of (i) disposing a rod including, consisting essentially of, or consisting of Ta and/or a Ta alloy into a tube including, consisting essentially of, or consisting of Cu to form a clad rod, (ii) reducing a diameter of the clad rod, and (iii) optionally, altering a cross-sectional shape of the clad rod. Altering the cross-sectional shape of the clad rod may include, consist essentially of, or consist of drawing the clad rod through a hexagonal die. Altering the cross-sectional shape of the clad monofilament stack may include, consist essentially of, or consist of drawing the clad rod through a hexagonal die.

The core of one or more (or even each) of the stabilizing elements may include, consist essentially of, or consist of Ta. The core of one or more (or even each) of the stabilizing elements may include, consist essentially of, or consist of a Ta alloy, e.g., an alloy of Ta with at least one of W, C, or N. The core of one or more (or even each) of the stabilizing elements may include, consist essentially of, or consist of Ta-3W. Sn may be disposed within or on the wire. The wire may be annealed to form a $Nb_3Sn$ phase within the wire.

In yet another aspect, embodiments of the invention feature a superconducting wire that includes, consists essentially of, or consists of a wire matrix, a stabilizing element, and a plurality of composite filaments. The wire matrix includes, consists essentially of, or consists of Cu. The stabilizing element is embedded within the wire matrix. The stabilizing element includes, consists essentially of, or consists of a core and a cladding at least partially surrounding the core. The core of the stabilizing element includes, consists essentially of, or consists of Ta and/or a Ta alloy. The cladding of the stabilizing element includes, consists essentially of, or consists of Cu. The composite filaments are embedded within the wire matrix and at least partially surround the stabilizing element. One or more (or even each) of the composite filaments includes, consists essentially of, or consists of a plurality of monofilaments and a cladding at least partially surrounding the plurality of monofilaments. The cladding of one or more (or even each) of the composite filaments includes, consists essentially of, or consists of Cu. One or more (or even each) of the monofilaments includes, consists essentially of, or consists of a core and a cladding at least partially surrounding the core. The core of one or more (or even each) of the monofilaments includes, consists essentially of, or consists of Nb. The cladding of one or more (or even each) of the monofilaments includes, consists essentially of, or consists of Cu. The stabilizing element extends through an axial dimension of the wire.

Embodiments of the invention may include one or more of the following in any of a variety of combinations. The core of one or more (or even each) of the monofilaments may include, consist essentially of, or consist of Nb—Ti. The core of one or more (or even each) of the monofilaments may include, consist essentially of, or consist of $Nb_3Sn$. The core of the stabilizing element may include, consist essentially of, or consist of Ta. The core of the stabilizing element may include, consist essentially of, or consist of a Ta alloy, e.g., an alloy of Ta with at least one of W, C, or N. The core of the stabilizing element may include, consist essentially of, or consist of Ta-3W. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire. One or more (or even each) of the composite filaments may have a substantially hexagonal cross-sectional shape. One or more (or even each) of the monofilaments may have a substantially hexagonal cross-sectional shape. The stabilizing element may have a substantially hexagonal cross-sectional shape. The stabilizing element may be disposed proximate a radial center of the wire.

In another aspect, embodiments of the invention feature a superconducting wire that includes, consists essentially of, or consists of a wire matrix and a plurality of composite filaments embedded within the wire matrix. The wire matrix includes, consists essentially of, or consists of Cu. One or more (or even each) of the composite filaments includes, consists essentially of, or consists of (i) a first stabilizing element extending through an axial dimension of the composite filament, (ii) a plurality of monofilaments radially surrounding the first stabilizing element, and (iii) a cladding at least partially surrounding the plurality of monofilaments and the first stabilizing element. The cladding of one or more (or even each) of the composite filaments includes, consists essentially of, or consists of Cu. One or more (or even each) of the monofilaments includes, consists essentially of, or consists of a core and a cladding at least partially surrounding the core. The core of one or more (or even each) of the monofilaments includes, consists essentially of, or consists of Nb. The cladding of one or more (or even each) of the monofilaments includes, consists essentially of, or consists of Cu. One or more (or even each) of the first stabilizing elements includes, consists essentially of, or consists of a core and a cladding at least partially surrounding the core. The core of one or more (or even each) of the first stabilizing elements includes, consists essentially of, or consists of Ta and/or a Ta alloy. The cladding of one or more (or even each) of the first stabilizing elements includes, consists essentially of, or consists of Cu.

Embodiments of the invention may include one or more of the following in any of a variety of combinations. The wire may include a second stabilizing element embedded within the wire matrix and/or at least partially surrounded by the plurality of composite filaments. The second stabilizing element may extend through an axial dimension of the wire. The second stabilizing element may include, consist essentially of, or consist of a core and a cladding at least partially surrounding the core. The core of the second stabilizing element may include, consist essentially of, or consist of Ta and/or a Ta alloy. The cladding of the second stabilizing element may include, consist essentially of, or consist of Cu. The second stabilizing element may be disposed proximate a radial center of the wire. The core of the second stabilizing element may include, consist essentially of, or consist of Ta. The core of the second stabilizing element may include, consist essentially of, or consist of a Ta alloy, e.g., an alloy of Ta with at least one of W, C, or N. The core of the second stabilizing element may include, consist essentially of, or consist of Ta-3W. The second stabilizing element may occupy less than approximately 20% of a cross-section of the wire, less than approximately 10% of a cross-section of the wire, or less than approximately 5% of a cross-section of the wire. The second stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

The core of one or more (or even each) of the monofilaments may include, consist essentially of, or consist of Nb—Ti. The core of one or more (or even each) of the monofilaments may include, consist essentially of, or consist of $Nb_3Sn$. The core of one or more (or even each) of the first stabilizing elements may include, consist essentially of, or consist of Ta. The core of one or more (or even each) of the first stabilizing elements may include, consist essentially of, or consist of a Ta alloy, e.g., an alloy of Ta with at least one of W, C, or N. The core of one or more (or even each) of the first stabilizing elements may include, consist essentially of, or consist of Ta-3W. One or more (or even each) of the composite filaments may have a hexagonal cross-sectional shape. One or more (or even each) of the monofilaments may have a hexagonal cross-sectional shape. One or more (or even each) of the first stabilizing elements may have a hexagonal cross-sectional shape. For one or more (or even each) of the composite filaments, the first stabilizing element may be disposed proximate a radial center of the composite filament. For one or more (or even each) of the composite filaments, the first stabilizing element may occupy less than approximately 20% of a cross-section of the composite filament, less than approximately 10% of a cross-section of the composite filament, or less than approximately 5% of a cross-section of the composite filament. For one or more (or even each) of the composite filaments, the first stabilizing element may occupy more than approximately 1% of a cross-section of the composite filament, more than approximately 2% of a cross-section of the composite filament, more than approximately 5% of a cross-section of the composite filament, more than approximately 8% of a cross-section of the composite filament, or more than approximately 10% of a cross-section of the composite filament.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function. As used herein, "consisting essentially of at least one metal" refers to a metal or a mixture of two or more metals but not compounds between a metal and a non-metallic element or chemical species such as oxygen, silicon, or nitrogen (e.g., metal nitrides, metal silicides, or metal oxides); such non-metallic elements or chemical species may be present, collectively or individually, in trace amounts, e.g., as impurities.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
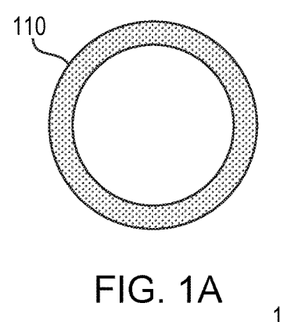
FIG. 1A is a schematic cross-sectional view of a ring utilized to form a monofilament in accordance with various embodiments of the invention.
Figure 1B:
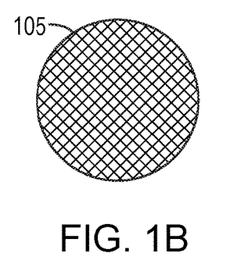
FIG. 1B is a schematic cross-sectional view of a rod utilized to form a monofilament in accordance with various embodiments of the invention.
Figure 1C:
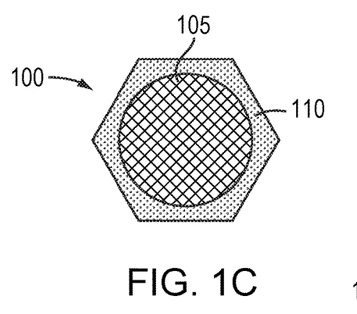
FIG. 1C is a schematic cross-sectional view of a monofilament utilized to form a composite filament in accordance with various embodiments of the invention.

FIGS. 1A-1C depict components of an exemplary monofilament 100 and constituent components thereof. In accordance with embodiments of the invention, a rod 105 is disposed within a tube 110 that includes, consists essentially of, or consists of Cu or a Cu alloy. The composition of the rod 105 may be selected based on the particular metallic superconductor desired in the final wire. For example, the rod 105 may include, consist essentially of, or consist of Nb, Ti, Nb—Ti, or an alloy thereof. The rod 105 clad with the tube 110 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the monofilament 100 shaped for efficient stacking with other monofilaments. For example, as shown in FIG. 1C, a hexagonal die may be utilized to form a monofilament 100 having a hexagonal cross-section. In other embodiments, monofilaments may have other cross-sections, e.g., square, rectangular, triangular, etc.

Figure 2A:
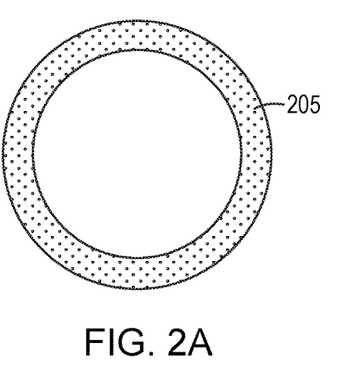
FIG. 2A is a schematic cross-sectional view of a ring utilized to form a composite filament in accordance with various embodiments of the invention.
Figure 2B:
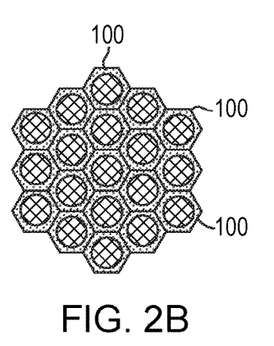
FIG. 2B is a schematic cross-sectional view of a stack of monofilaments utilized to form a composite filament in accordance with various embodiments of the invention.
Figure 2C:
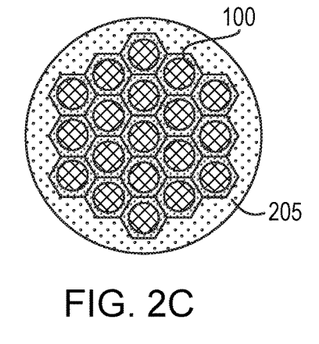
FIG. 2C is a schematic cross-sectional view of a composite filament at an initial stage of fabrication in accordance with various embodiments of the invention.
Figure 2D:
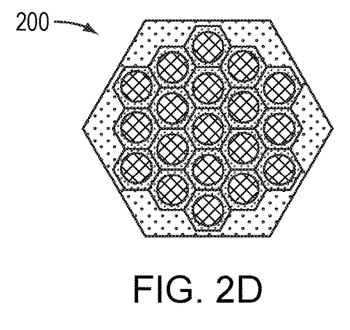
FIG. 2D is a schematic cross-sectional view of a composite filament utilized to form superconducting wires in accordance with various embodiments of the invention.

Once a monofilament 100 is fabricated, other monofilaments 100 may also be fabricated in the same manner, or one or more monofilaments 100 may be divided into multiple pieces. Multiple monofilaments may be stacked together to form at least a portion of a composite filament. FIGS. 2A-2D depict various components and assembly of a composite filament 200. As shown in FIG. 2B, multiple monofilaments 100 may be stacked together in an arrangement that will subsequently become at least a portion of the core of composite filament 200. While FIG. 2B depicts the stacking of 19 different monofilaments 100, embodiments of the invention may include more or fewer monofilaments 100. The stacked assembly of monofilaments 100 may be disposed within a tube 205 that includes, consists essentially of, or consists of Cu or a Cu alloy. Before and/or after the monofilaments 100 are disposed within the tube 205, the monofilaments 100 and/or the tube 205 may be cleaned and/or etched (e.g., via a cleaning agent including, consisting essentially of, or consisting of one or more acids) to, for example, remove surface oxides and/or other contaminants. As shown in FIG. 2C, the tube 205 may be compacted onto the monofilaments 100 by, e.g., swaging, extruding, and/or rolling. The clad stacked monofilaments 100 may be annealed to promote bonding between the various monofilaments 100 in the stacked assembly. For example, the clad stacked monofilaments may be annealed at a temperature between approximately 300° C. and approximately 500° C. (e.g., approximately 400° C.) for a time of approximately 0.5 hour and approximately 3 hours (e.g., approximately 1 hour). The resulting assembly may be drawn down one or more times to reduce its diameter, and may subsequently be drawn through a shaped die in order to provide composite filament 200 with a cross-sectional shape configured for efficient stacking. For example, as shown in FIG. 2D, a hexagonal die may be utilized to form a composite filament 200 having a hexagonal cross-section. In other embodiments, composite filaments 200 may have other cross-sections, e.g., square, rectangular, triangular, round, off-round, elliptical, etc. In various embodiments, the cross-sectional size and/or shape of the composite filament 200 after processing and shaping is equal to the cross-sectional size and/or shape of the monofilament 100 utilized in the initial stacked assembly before being reduced in size (i.e., shown in FIG. 2B).

Figures 3A, 3B, 3C, 4A, 4B, 4C:
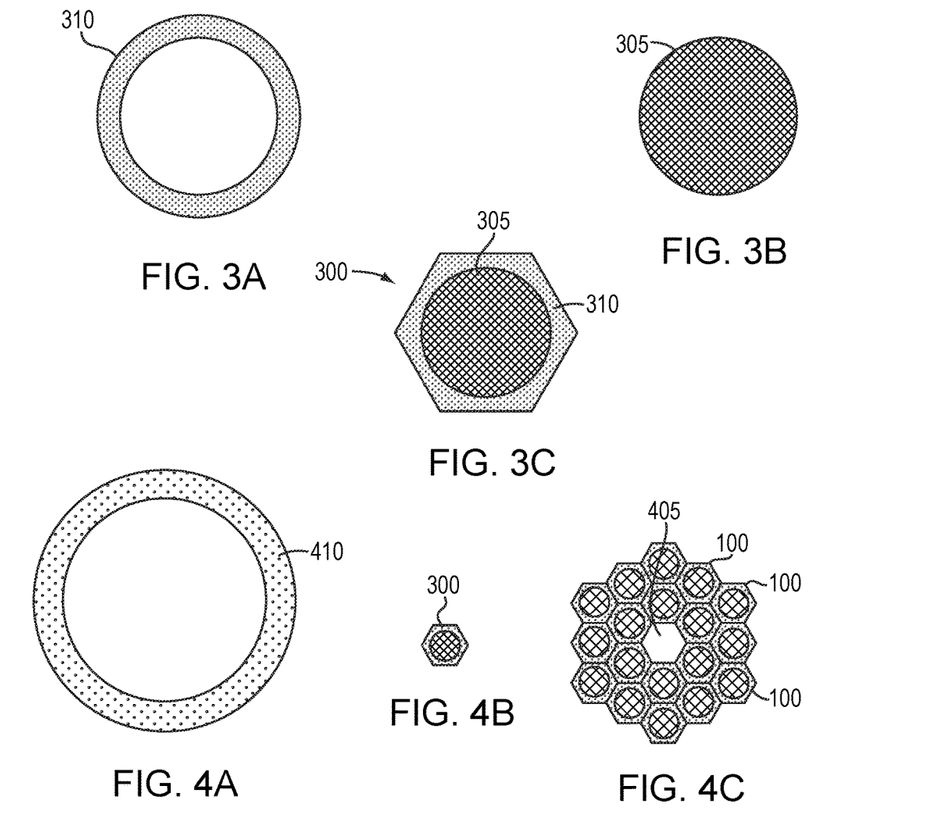
FIG. 3A is a schematic cross-sectional view of a ring utilized to form a stabilizing element in accordance with various embodiments of the invention.
FIG. 3B is a schematic cross-sectional view of a rod utilized to form a stabilizing element in accordance with various embodiments of the invention.
FIG. 3C is a schematic cross-sectional view of a stabilizing element utilized to form stabilized composite filaments and/or superconducting wires in accordance with various embodiments of the invention.
FIG. 4A is a schematic cross-sectional view of a ring utilized to form a stabilized composite filament in accordance with various embodiments of the invention.
FIG. 4B is a schematic cross-sectional view of a stabilizing element utilized to form a stabilized composite filament in accordance with various embodiments of the invention.
FIG. 4C is a schematic cross-sectional view of a stack of monofilaments utilized to form a stabilized composite filament in accordance with various embodiments of the invention.

Superconducting wires in accordance with embodiments of the invention may also incorporate stabilizing elements that provide additional mechanical strength while not compromising the drawability and/or electrical performance of the wires. FIGS. 3A-3C depict the fabrication of a stabilizing element 300 via a method similar to that detailed above for monofilaments 100. In accordance with embodiments of the invention, a rod 305 is disposed within a tube 310 that includes, consists essentially of, or consists of Cu or a Cu alloy. The rod 305 may include, consist essentially of, or consist of one or more metals having mechanical strength (e.g., tensile strength, yield strength, etc.) greater than that of rods 105 utilized to fabricate monofilaments 100. For example, the rod 305 may include, consist essentially of, or consist of Ta or a Ta alloy (e.g., a Ta—W alloy such as Ta-3W). The rod 305 clad with the tube 310 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the stabilizing element 300 shaped for efficient stacking with monofilaments 100 and/or composite filaments 200. For example, as shown in FIG. 3C, a hexagonal die may be utilized to form a stabilizing element 300 having a hexagonal cross-section. In other embodiments, stabilizing elements 300 may have other cross-sections, e.g., square, rectangular, triangular, etc. In various embodiments, stabilizing elements 300 may have cross-sectional sizes and/or shapes substantially the same as cross-sectional sizes and/or shapes of monofilaments 100 and/or composite filaments 200.

Figure 4D:
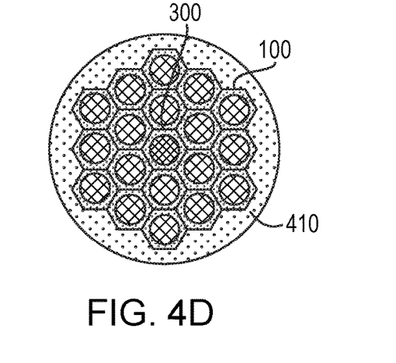
FIG. 4D is a schematic cross-sectional view of a stabilized composite filament at an initial stage of fabrication in accordance with various embodiments of the invention.
Figure 4E:
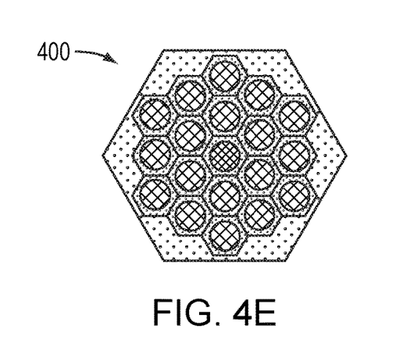
FIG. 4E is a schematic cross-sectional view of a stabilized composite filament utilized to form superconducting wires in accordance with various embodiments of the invention.

In accordance with embodiments of the invention, stabilizing elements 300 may be incorporated into one or more locations within a composite filament for increased mechanical stability. For example, as shown in FIGS. 4A-4E, a stabilized composite filament 400 featuring one or more stabilizing elements 300 therewithin may be fabricated via a process similar to that described above for composite filaments 200. As shown in FIG. 4C, multiple monofilaments 100 may be stacked together in an arrangement that will subsequently become at least a portion of the core of composite filament 200. As shown, the assembly of stacked monofilaments 100 may define therewithin one or more voids 405 each sized and shaped to accommodate one or more stabilizing elements 300. While FIG. 4C depicts the stacking of 18 different monofilaments 100 and one void 405 therewithin, embodiments of the invention may include more or fewer monofilaments 100 and/or more voids 405. While FIG. 4C depicts the void 405 as being disposed substantially at the center of the stacked assembly of monofilaments 100, in accordance with embodiments of the invention, one or more voids 405 may be disposed at other locations within the stacked assembly in addition to or instead of the void 405 disposed at the center. The stacked assembly of monofilaments 100 may be disposed within a tube 410 that includes, consists essentially of, or consists of Cu or a Cu alloy. Before or after the monofilaments 100 are disposed within the tube 410, one or more stabilizing elements 300 may be disposed within each of the voids 405. Before and/or after the monofilaments 100 and the stabilizing elements 300 are disposed within the tube 410, the monofilaments 100, the stabilizing elements 300, and/or the tube 410 may be cleaned and/or etched (e.g., via a cleaning agent including, consisting essentially of, or consisting of one or more acids) to, for example, remove surface oxides and/or other contaminants. As shown in FIG. 4D, the tube 410 may be compacted onto the monofilaments 100 and stabilizing elements 300 by, e.g., swaging, extruding, and/or rolling. The clad stacked monofilaments 100 and stabilizing elements 300 may be annealed to promote bonding between the various monofilaments 100 and stabilizing elements 300 in the stacked assembly. For example, the clad stacked monofilaments and stabilizing elements may be annealed at a temperature between approximately 300° C. and approximately 500° C. (e.g., approximately 400° C.) for a time of approximately 0.5 hour and approximately 3 hours (e.g., approximately 1 hour). The resulting assembly may be drawn down one or more times to reduce its diameter, and may subsequently be drawn through a shaped die in order to provide stabilized composite filament 400 with a cross-sectional shape configured for efficient stacking. For example, as shown in FIG. 4E, a hexagonal die may be utilized to form a stabilized composite filament 400 having a hexagonal cross-section. In other embodiments, stabilized composite filaments 400 may have other cross-sections, e.g., square, rectangular, triangular, etc. In various embodiments, the cross-sectional size and/or shape of the stabilized composite filament 400 after processing and shaping is equal to the cross-sectional size and/or shape of the monofilament 100 and/or the stabilizing element 300 utilized in the initial stacked assembly before being reduced in size (i.e., shown in FIGS. 4B and 4C).

Figure 5A:
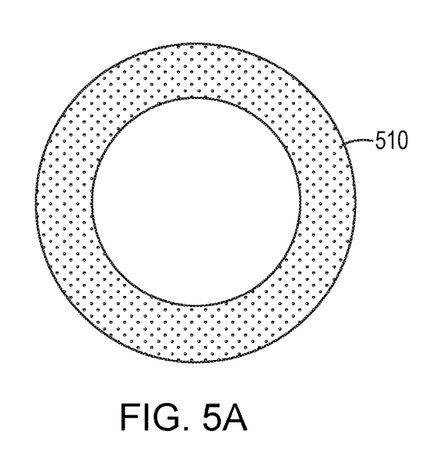
FIG. 5A is a schematic cross-sectional view of a ring utilized to form a superconducting wire in accordance with various embodiments of the invention.
Figure 5B:
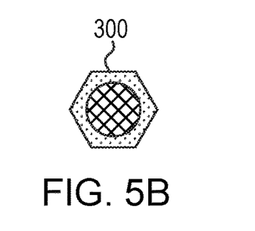
FIG. 5B is a schematic cross-sectional view of a stabilizing element utilized to form a superconducting wire in accordance with various embodiments of the invention.
Figure 5C:
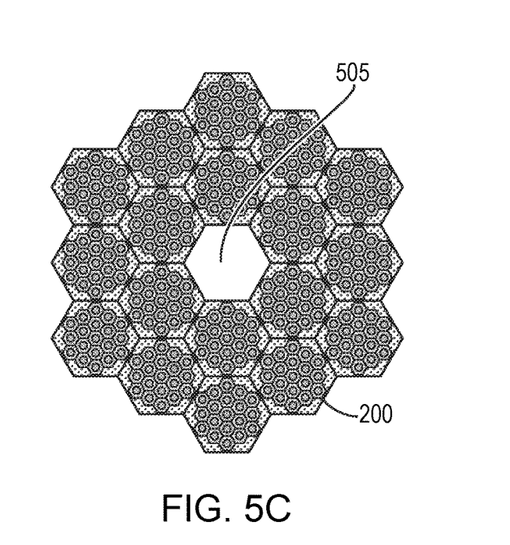
FIG. 5C is a schematic cross-sectional view of a stack of composite filaments utilized to form a superconducting wire in accordance with various embodiments of the invention.
Figure 5D:
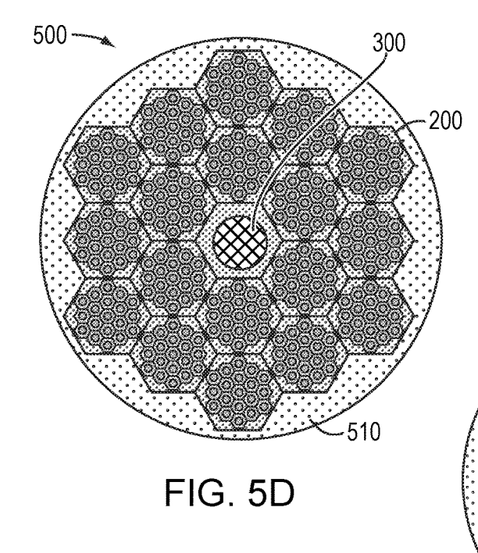
FIG. 5D is a schematic cross-sectional view of a superconducting wire at an initial stage of fabrication in accordance with various embodiments of the invention.
Figure 5E:
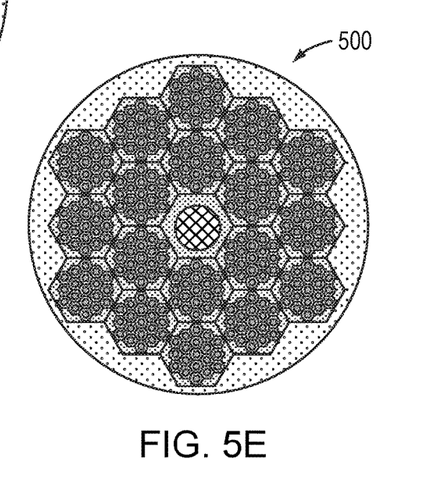
FIG. 5E is a schematic cross-sectional view of a superconducting wire in accordance with various embodiments of the invention.

In accordance with embodiments of the invention, superconducting wires and/or wire preforms may be fabricated utilizing assemblies of composite filaments 200, stabilized composite filaments 400, and/or stabilizing elements 300. FIGS. 5A-5E depict various stages of the fabrication of an exemplary superconducting wire 500. As shown in FIG. 5C, multiple composite filaments 200 and/or stabilized composite filaments 400 may be stacked together in an arrangement that will subsequently become at least a portion of the core of superconducting wire 500. As shown, the assembly of stacked composite filaments 200 and/or stabilized composite filaments 400 may define therewithin one or more voids 505 each sized and shaped to accommodate one or more stabilizing elements 300. In other embodiments, e.g., embodiments utilizing stabilized composite filaments 400 that incorporate therewithin stabilizing elements 300, no voids 505 may be present within the stack. While FIG. 5C depicts the stacking of 18 different composite filaments 200 and one void 505 therewithin, embodiments of the invention may include more or fewer composite filaments 200, one or more stabilized composite filaments 400, and/or more (or no) voids 505. While FIG. 5C depicts the void 505 as being disposed substantially at the center of the stacked assembly of composite filaments 200, in accordance with embodiments of the invention, one or more voids 505 may be disposed at other locations within the stacked assembly in addition to or instead of the void 505 disposed at the center. The stacked assembly of composite filaments 200 and/or stabilized composite filaments 400 may be disposed within a tube 510 that includes, consists essentially of, or consists of Cu or a Cu alloy. Before or after the composite filaments 200 and/or stabilized composite filaments 400 are disposed within the tube 510, one or more stabilizing elements 300 may be disposed within each of the voids 505. Before and/or after the composite filaments 200 and/or stabilized composite filaments 400 and the stabilizing elements 300 are disposed within the tube 510, the composite filaments 200 and/or stabilized composite filaments 400, the stabilizing elements 300, and/or the tube 510 may be cleaned and/or etched (e.g., via a cleaning agent including, consisting essentially of, or consisting of one or more acids) to, for example, remove surface oxides and/or other contaminants. As shown in FIG. 5D, the tube 510 may be compacted onto the composite filaments 200 and/or stabilized composite filaments 400 and stabilizing elements 300 by, e.g., swaging, extruding, and/or rolling. The clad stacked composite filaments 200 and/or stabilized composite filaments 400 and stabilizing elements 300 may be annealed to promote bonding between the various composite filaments 200 and/or stabilized composite filaments 400 and stabilizing elements 300 in the stacked assembly. For example, the clad stack may be annealed at a temperature between approximately 300° C. and approximately 500° C. (e.g., approximately 400° C.) for a time of approximately 0.5 hour and approximately 3 hours (e.g., approximately 1 hour). The resulting assembly may be drawn down one or more times to reduce its diameter, as shown in FIG. 5E. Before or after drawing, the superconducting wire 500 may be annealed to, e.g., relax residual stresses and/or promote recrystallization therein.

In various embodiments, the superconducting wire 500, composite filament 200, and/or stabilized composite filament 400 may be mechanically processed for diameter reduction and/or to promote bonding between their constituent elements prior to wire drawing steps. For example, the superconducting wire 500, composite filament 200, and/or stabilized composite filament 400 may be extruded, swaged, and/or rolled prior to the final drawing step(s). In various embodiments, the superconducting wire 500, composite filament 200, and/or stabilized composite filament 400 may be heat treated during and/or after each of multiple different drawing steps for strain relief. For example, during and/or after one or more of the drawing steps, the superconducting wire 500, composite filament 200, and/or stabilized composite filament 400 may be annealed at temperatures from approximately 360° C. to approximately 420° C. for a time period of, e.g., approximately 20 hours to approximately 40 hours.

In various embodiments of the present invention, the superconducting wire 500 may be cooled below the critical temperature of the filaments therewithin and utilized to conduct electrical current. In some embodiments, multiple superconducting wires 500 are coiled together to form a single superconducting cable.

While some superconducting wires 500 (e.g., those incorporating Nb—Ti-containing filaments) may be utilized directly in superconducting applications, the fabrication processes for various other superconducting wires 500 may incorporate one or more steps to incorporate a portion of the superconducting phase. For example, $Nb_3Sn$ superconducting phases, once formed, are typically brittle and may not be further drawn or otherwise mechanically deformed without damage. Thus, embodiments of the present invention may be utilized to fabricate superconducting wires 500 that incorporate Nb and Sn separate from each other; once the wires 500 are mostly or fully fabricated, the wires 500 may be annealed to interdiffuse the Nb and Sn and form the superconducting $Nb_3Sn$ phase therewithin. For example, the drawn wire may be annealed at temperatures from approximately 650° C. to approximately 700° C. for a time period of, e.g., approximately 50 hours to approximately 200 hours. In various embodiments, one or more of the Cu-based rings 110, 205, 310, 410, or 510 may incorporate Sn therewithin; e.g., one or more of the rings may include, consist essentially of, or consist of a Cu—Sn alloy (that includes, e.g., 13-15% Sn). Such materials are ductile, enabling the fabrication of the various filaments and wires as detailed herein. Thereafter, the wire 500 may be annealed, resulting in interdiffusion and the formation of the superconducting $Nb_3Sn$ phase at least at the interface between the Nb and the Cu—Sn.

In other embodiments, pure Sn or an Sn alloy (e.g., an Sn alloy with Cu or magnesium (Mg)) may be incorporated (e.g., in the form of a rod or ring) within one or more of the stacks utilized to form composite filaments 200, stabilized composite filaments 400, and/or wires 500; after formation of the composite filaments 200, stabilized composite filaments 400, and/or wires 500 as detailed herein, an annealing step may be performed to form the superconducting $Nb_3Sn$ phase. In yet another embodiment of the present invention, the superconducting wire 500 may be fabricated as detailed herein and, thereafter, the wire 500 may be coated with Sn or an Sn alloy. The coated wire may subsequently be annealed, forming a Sn—Cu phase that eventually reacts with the Nb-containing filaments to form the $Nb_3Sn$ phase.

EXAMPLE

An experiment was performed to compare the drawing properties of superconducting wires (or precursors thereof) incorporating Nb-based filaments with and without stabilizing elements. The fabrication of the filaments began by cladding annealed Nb rods with oxygen-free electronic (OFE) Cu tubing by sinking a tube having a slightly larger inner diameter than the diameter of the rod, which was approximately 0.4 inch. (As known in the art, OFE Cu is at least 99.99% pure and has an oxygen content no greater than 0.0005%.) The fabrication of the stabilizing elements began by cladding either annealed Ta-3W or annealed Ta rods with OFE Cu tubes in a similar manner. The wall thickness of the Cu tubes was 0.028 inch. The Cu-clad Nb, Ta-3W, and Ta rods were cold drawn in 20% area reduction per pass steps to 0.144 inch diameter. From 0.144 inch diameter, the round monofilaments and stabilizing elements were drawn through a hexagonal shaped die (0.120 inch flat to flat). The Nb hexagonal monofilaments were each cut into 18 or 19 equal length pieces.

The monofilament pieces were lightly etched in a mixture of nitric acid and water to remove surface oxides and then stacked in a 19-element hexagonal array and inserted into an OFE Cu tube having a 0.028 inch wall thickness. The Cu tube was also acid etched just prior to assembly. The 19-element assemblies were swaged to compact the copper tube onto the hexagonal stack and then cold drawn through about 50% area reduction. The assemblies were subjected to a heat treatment of 400° C. for 1 hour to promote inter-element bonding. After the bonding heat treatment, the assemblies were cold drawn to 0.138 inch in ~10% area reduction per pass steps. From 0.138 inch, the assemblies were drawn through the 0.120 inch flat-to-flat hexagonal die. Thereafter, the 19-element assemblies were given a nominal 300° C. heat treatment for 3 hours. After this heat treatment, the assemblies (i.e., composite filaments) were cut into multiple pieces for formation of various wires.

Arrays of the Nb composite filaments were assembled into three different wires. In the first wire, 18 composite filaments were stacked around a central pure annealed Cu element to form a control sample (Sample 1) with no stabilizing elements (i.e., a core region or other region of a wire containing Cu or the same material as the wire matrix is not considered a "stabilizing element" as utilized herein). The other wires incorporated central Ta (Sample 2) or Ta-3W (Sample 3) stabilizing elements surrounded by 18 of the Nb composite filaments. The stacks were sunk into annealed Cu tubes having 0.060 inch wall thickness. Prior to assembly, the composite filaments, stabilizing elements, and the Cu tube were acid cleaned in a mixture of nitric acid and water. The various elements were rinsed with water and stored in isopropyl alcohol until just before assembly.

The stacks were clad and compacted via swaging within 20 minutes of removing the elements from alcohol storage after the acid cleaning. Each assembly was processed from stacking to 0.325 inch diameter individually and as quickly as could be swage pointed and drawn. When all three assemblies were at 0.325 inch diameter, further processing was done in parallel. All three were drawn through a die before moving on to the next smallest size. The wires were drawn to 0.0285 inch diameter, and samples were collected at various steps during diameter reduction. Below 0.1285 inch diameter, a sample was collected from each wire at approximately each 50% total area reduction. Samples at diameters of 0.1285 inch, 0.0907 inch, 0.066 inch, 0.050 inch, and 0.032 inch were collected for microscopy and tensile testing. All of the samples were annealed at 250° C. for 8 hours before tensile testing.

Figure 6:
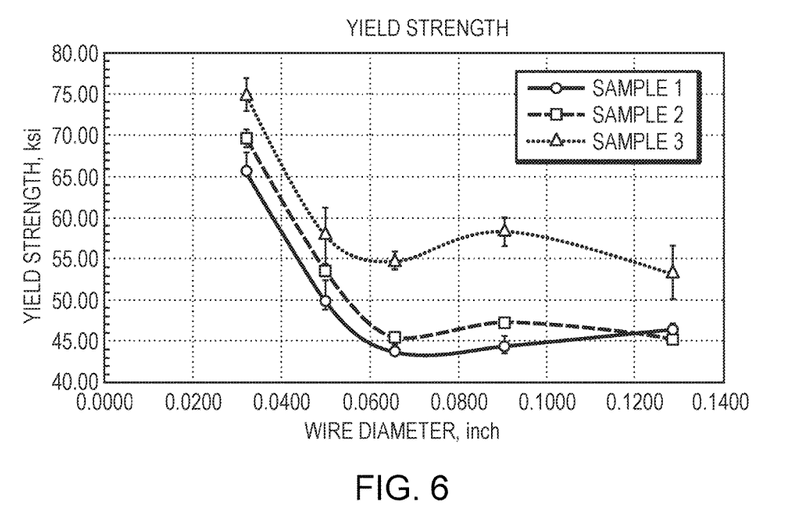
FIG. 6 is a graph of yield strength as a function of wire diameter during tensile testing of a wire lacking a stabilizing element, a wire featuring a Ta stabilizing element in accordance with various embodiments of the invention, and a wire featuring a Ta-3W stabilizing element in accordance with various embodiments of the invention.
Figure 7:
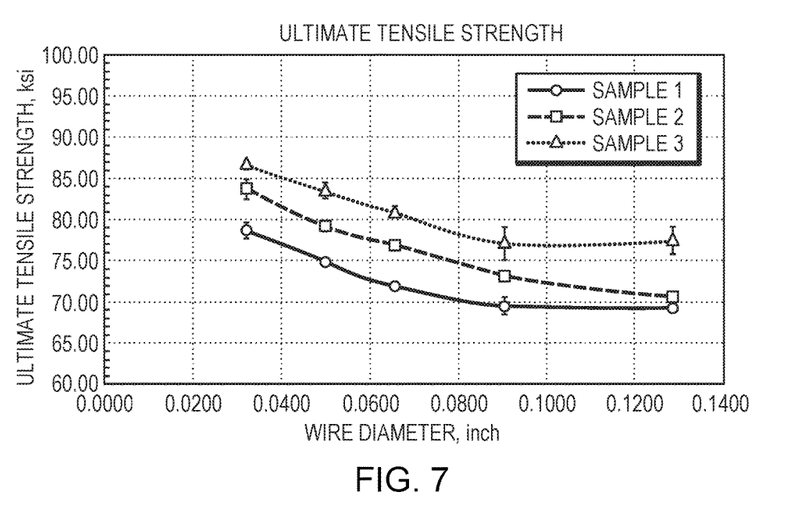
FIG. 7 is a graph of ultimate tensile strength as a function of wire diameter during tensile testing of a wire lacking a stabilizing element, a wire featuring a Ta stabilizing element in accordance with various embodiments of the invention, and a wire featuring a Ta-3W stabilizing element in accordance with various embodiments of the invention

FIGS. 6 and 7 graphically depict the yield strength (FIG. 6) and ultimate tensile strength (FIG. 7) for each of Samples 1, 2, and 3 at each of the different diameters selected for testing in accordance with ASTM E8/E8M-15a, Standard Test Methods for Tension Testing of Metallic Materials, ASTM International, West Conshohocken, Pa., 2015, the entire disclosure of which is incorporated by reference herein. Multiple samples at each wire diameter were tested, and the standard deviations of the results are indicated as error bars on FIGS. 6 and 7. As shown, Samples 2 and 3 featuring the stabilizing elements exhibit superior mechanical properties when compared to Sample 1 that lacks a stabilizing element. Thus, such wires in accordance with embodiments of the invention will provide superior reliability. In addition, Sample 3 featuring the Ta-3W stabilizing element is consistently stronger, at all diameters, than Sample 2 that features the Ta stabilizing element. Note that all of the core regions of each of the Samples had the same diameter prior to processing. Thus, stabilizing elements in accordance with embodiments of the invention could have even smaller diameters while providing superconducting wires with superior mechanical properties; such wires may incorporate larger-diameter superconducting filaments to further improve their current-carrying performance, even at the same nominal diameter for the wire itself.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming a mechanically stabilized superconducting wire, the method comprising:
   providing a plurality of monofilaments each comprising a monofilament core comprising Nb and, surrounding the monofilament core, a monofilament cladding comprising Cu;
   providing a stabilizing element comprising a stabilizing core comprising an alloy of Ta with at least one of W, C, or N and, surrounding the stabilizing core, a stabilizing cladding comprising Cu;
   fabricating a plurality of composite filaments by, for each composite filament, (i) assembling a plurality of the monofilaments into a monofilament stack, (ii) surrounding the monofilament stack with a composite-filament cladding comprising Cu, (iii) reducing a diameter of the clad monofilament stack, and (iv) altering a cross-sectional shape of the clad monofilament stack;
   assembling a plurality of the composite filaments and the stabilizing element into a composite stack, wherein the stabilizing element extends through a radial dimension of the composite stack;
   surrounding the composite stack with a wire cladding comprising Cu; and
   reducing a diameter of the clad composite stack to form a wire, thereby forming a superconducting wire comprising:
      a wire matrix comprising Cu;
      embedded within the wire matrix, a stabilizing element comprising only a single stabilizing core comprising an alloy of Ta with at least one of W, C, or N and, surrounding the single stabilizing core, a stabilizing cladding comprising Cu; and
      a plurality of composite filaments embedded within the wire matrix and surrounding the stabilizing element, wherein:
         each composite filament comprises (i) a plurality of monofilaments and (ii) a composite-filament cladding comprising Cu surrounding the plurality of monofilaments,
         each monofilament comprises a superconducting monofilament core comprising Nb and, surrounding the superconducting monofilament core, a monofilament cladding comprising Cu,
         the stabilizing element extends through an axial dimension of the wire,
         the stabilizing element is the only stabilizing element within the wire,
         the stabilizing element occupies at least 2% of a cross-section of the wire, and
         the stabilizing element is disposed in direct mechanical contact with at least some of the composite filaments.

2. The method of claim 1, wherein the stabilizing element is disposed substantially at a radial center of the composite stack.

3. The method of claim 1, wherein each monofilament is provided by a process comprising (i) disposing a rod comprising Nb into a tube comprising Cu to form a clad rod, (ii) reducing a diameter of the clad rod, and (iii) altering a cross-sectional shape of the clad rod.

4. The method of claim 3, wherein altering the cross-sectional shape of the clad rod comprises drawing the clad rod through a hexagonal die.

5. The method of claim 1, wherein providing the stabilizing element comprises (i) disposing a rod comprising Ta or a Ta alloy into a tube comprising Cu to form a clad rod, (ii) reducing a diameter of the clad rod, and (iii) altering a cross-sectional shape of the clad rod.

6. The method of claim 5, wherein altering the cross-sectional shape of the clad rod comprises drawing the clad rod through a hexagonal die.

7. The method of claim 1, wherein altering the cross-sectional shape of the clad monofilament stack comprises drawing the clad monofilament stack through a hexagonal die.

8. The method of claim 1, wherein the stabilizing core of the stabilizing element comprises Ta-3W.

9. The method of claim 1, further comprising (i) disposing Sn within or on the wire and (ii) annealing the wire to form a $Nb_3Sn$ phase within the wire.

10. The method of claim 1, wherein the core of the stabilizing element consists of the alloy of Ta with at least one of W, C, or N.

11. The method of claim 1, wherein the stabilizing element occupies less than approximately 10% of the cross-section of the wire.

12. A superconducting wire comprising:
    a wire matrix comprising Cu;
    embedded within the wire matrix, a stabilizing element comprising only a single stabilizing core comprising an alloy of Ta with at least one of W, C, or N and, surrounding the single stabilizing core, a stabilizing cladding comprising Cu; and a plurality of composite filaments embedded within the wire matrix and surrounding the stabilizing element, wherein:

each composite filament comprises (i) a plurality of monofilaments and (ii) a composite-filament cladding comprising Cu surrounding the plurality of monofilaments, each monofilament comprises a superconducting monofilament core comprising Nb and, surrounding the superconducting monofilament core, a monofilament cladding comprising Cu, the stabilizing element extends through an axial dimension of the wire the stabilizing element is the only stabilizing element within the wire, the stabilizing element occupies at least 2% of a cross-section of the wire, and the stabilizing element is disposed in direct mechanical contact with at least some of the composite filaments.

13. The wire of claim 12, wherein each monofilament core comprises Nb—Ti.

14. The wire of claim 12, wherein each monofilament core comprises $Nb_3Sn$.

15. The wire of claim 12, wherein the stabilizing core of the stabilizing element comprises Ta-3W.

16. The wire of claim 12, wherein the stabilizing core of the stabilizing element consists of the alloy of Ta with at least one of W, C, or N.

17. The wire of claim 12, wherein the stabilizing element occupies less than approximately 10% of the cross-section of the wire.

18. The wire of claim 12, wherein each of the composite filaments has a hexagonal cross-sectional shape.

19. The wire of claim 12, wherein each of the monofilaments has a hexagonal cross-sectional shape.

20. The wire of claim 12, wherein the stabilizing element has a hexagonal cross-sectional shape.

21. The wire of claim 12, wherein the stabilizing element is disposed proximate a radial center of the wire.

22. The wire of claim 12, wherein the stabilizing core of the stabilizing element consists of Ta-3W.

* * * * *